(12) United States Patent
Kim et al.

(10) Patent No.: US 7,129,772 B2
(45) Date of Patent: Oct. 31, 2006

(54) CHARGE PUMP CIRCUIT

(75) Inventors: Kwang Hyun Kim, Kyungsangbuk-do (KR); Sun Suk Yang, Kyungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 76 days.

(21) Appl. No.: 10/906,638

(22) Filed: Feb. 28, 2005

(65) Prior Publication Data
US 2005/0195018 A1    Sep. 8, 2005

(30) Foreign Application Priority Data
Mar. 3, 2004   (KR) .................... 10-2004-0014266

(51) Int. Cl.
G05F 1/10    (2006.01)
G05F 3/02    (2006.01)
(52) U.S. Cl. ...................... 327/536; 327/534
(58) Field of Classification Search .............. None
See application file for complete search history.

(56) References Cited

U.S. PATENT DOCUMENTS

| | | | | |
|---|---|---|---|---|
| 5,553,030 A | * | 9/1996 | Tedrow et al. | 365/226 |
| 5,952,872 A | * | 9/1999 | Hur | 327/535 |
| 5,999,009 A | * | 12/1999 | Mitsui | 324/765 |
| 6,300,839 B1 | * | 10/2001 | Bazargan et al. | 331/57 |
| 6,597,235 B1 | * | 7/2003 | Choi | 327/536 |

* cited by examiner

Primary Examiner—Tuan T. Lam
Assistant Examiner—William Hernandez
(74) Attorney, Agent, or Firm—Marshall, Gerstein & Borun LLP

(57) ABSTRACT

A charge pump circuit comprises a decoder for generating a plurality of control signals, a ring oscillator an output frequency of which varies according to the plurality of the control signals, a charge pump for generating a high voltage, which is higher than an external voltage, according to an output of the ring oscillator, and a fuse tuning unit for fixing one of the plurality of the control signals.

21 Claims, 4 Drawing Sheets

CHARGE PUMP CIRCUIT

FIELD OF THE INVENTION

The present invention relates to a charge pump circuit, and more specifically, to a charge pump circuit which can freely control the speed of a charge pump.

DISCUSSION OF RELATED ART

A high voltage pulse that is higher than an external power supply Vcc has been widely used in DRAM circuits since it can compensate for the loss of threshold voltage of transistors. More particularly, circuits which employ the high voltage pulse include a word line driver circuit, a bit line separation circuit, a data output buffer and the like.

This high voltage pulse is generated by means of a VPP circuit. Load of the Vpp circuit is usually composed of a capacitor component. Two kinds of current flow in the load of the Vpp circuit. One of the current is a minute inverse bias leakage current that always flows through a PN junction, and the other of the current is a high excessive current for driving internal circuits whenever a chip is activated. Accordingly, the VPP level can be constantly maintained only when such charge loss is compensated for.

In the prior art, if such variation in the level occurs, charge pump circuits are driven by detecting lowering in the level and charges are pumped into the capacitor, so that a lower VPP level returns to its original value. In this case, however, there is a disadvantage in that it is not easy to control the pumping speed even when more rapid return of the level is needed. In order to make the pumping speed fast, the cycle of a ring oscillator within a charge pump circuit has to be made fast. For this, after a FIB (Focused Ion Beam) work is performed on options, a test has to be performed. A mask re-work is needed according to the test result. Thus, there is problem in that lots of time and cost is consumed.

SUMMARY OF THE INVENTION

Accordingly, the present invention has been made in view of the above problems, and it is an object of the present invention to provide a charge pump circuit in which the cycle of a ring oscillator within a charge pump circuit can be freely controlled in a wafer level in such a manner that a VPP level returns to its original value by rapidly supplying lost charges into capacitors when the VPP level reduces due to the charge loss, which occurs because a high excessive current for driving internal circuits flows whenever a chip is activated.

Another object of the present invention is to perform a test while changing the cycle of a ring oscillator according to an externally inputted control signal, and then fix an optimum value.

To achieve the above object, according to the present invention, there is provided a charge pump circuit, comprising a decoder for generating a plurality of control signals, a ring oscillator an output frequency of which varies according to the plurality of the control signals, a charge pump for generating a high voltage, which is higher than an external voltage, according to an output of the ring oscillator, and a fuse tuning unit for fixing one of the plurality of the control signals.

DETAILED DESCRIPTION OF PREFERRED EMBODIMENTS

Now, the preferred embodiments according to the present invention will be described with reference to the accompanying drawings.

Figure 1:
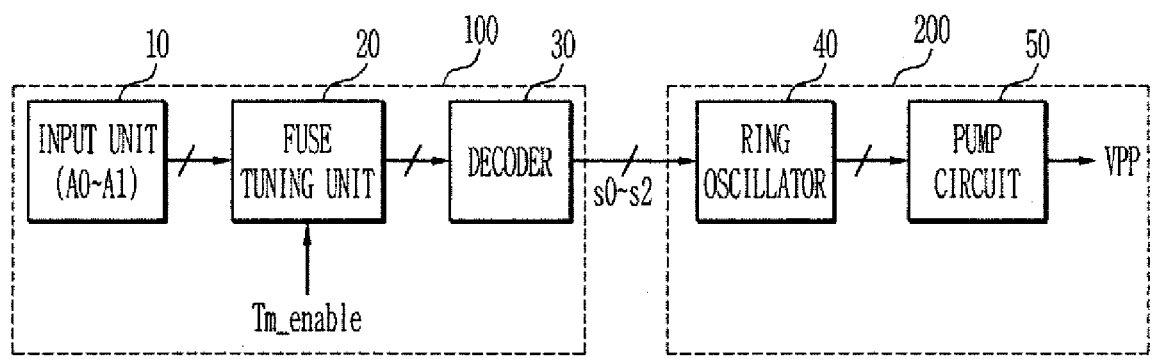
FIG. 1 is a block diagram illustrating the construction of a charge pump circuit according to the present invention.

FIG. 1 is a block diagram illustrating the construction of a charge pump circuit according to the present invention.

The charge pump circuit according to the present invention mainly includes a test mode control unit 100 and a charge pump block 200.

The test mode control unit 100 consists of an input unit 10, a fuse tuning unit 20 and a decoder 30. The input unit 10 uses e.g., addresses A0 and A1 as an input signal, but may include any logic signal.

The fuse tuning unit 20 operates according to a test mode enable signal Tm_enable and an address inputted to the input unit 10. Upon test, the fuse tuning unit 20 generates a logic signal according to the addresses A0 and A1 inputted to the input unit 10. After the test is completed, the output value can be fixed by cutting the fuse. The decoder 30 decodes the output signal of the fuse tuning unit 20 to generate, e.g., decode signals s0 to s2.

The charge pump block 200 includes a ring oscillator 40 and a pump circuit 50. The ring oscillator 40 generates a pulse signal. The cycle of the pulse signal varies depending on the output of the decoder. The pump circuit 50 generates VPP according to the output of the ring oscillator 40.

That is, the fuse tuning unit 20 generates the logic signal according to the input signals A0 and A1. The logic signal is decoded in the decoder 30. The frequency of the ring oscillator 40 varies according to the decoded signal, and the pumping speed of the pump circuit 50 varies according to the output of the ring oscillator 40.

If an optimum level is outputted after confirming a VPP level by means of the operation in the wafer level, the fuse composed of the fuse tuning unit is properly cut to fix the oscillation frequency of the ring oscillator.

Figure 2:
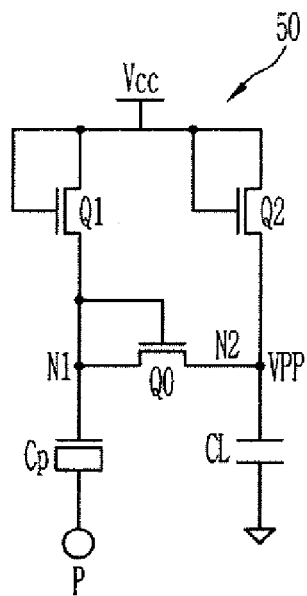
FIG. 2 is a detailed circuit diagram of a pump circuit shown in FIG. 1.

FIG. 2 is a detailed circuit diagram of the pump circuit shown in FIG. 1. The operation of the pump circuit will be described in detail with reference to FIG. 3.

Figure 3:
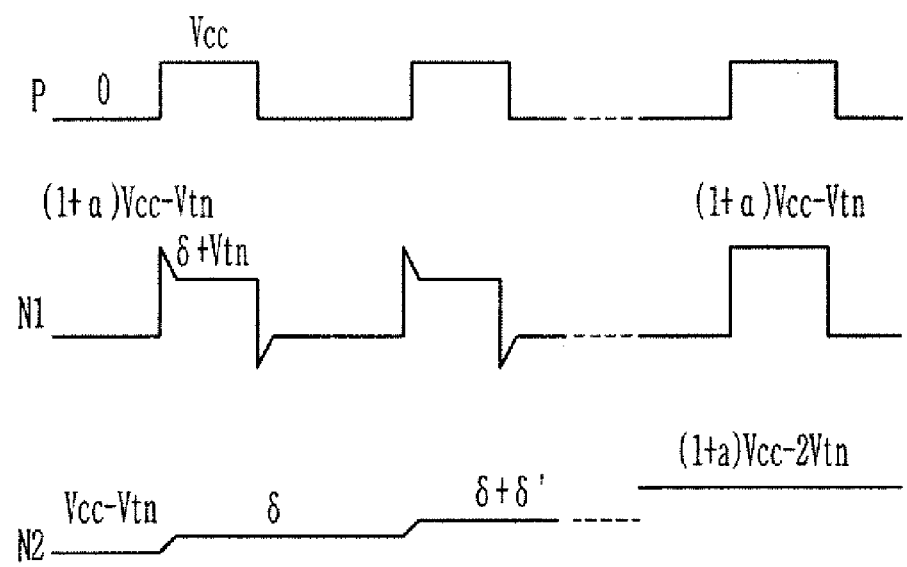
FIG. 3 is a waveform for explaining the operation of the pump circuit shown in FIG. 2.

With a pulse being not applied to an input terminal P, a node N1 and an output node N2 are charged to Vcc−Vtn by means of NMOS transistors Q1 and Q2. If a pulse P as shown in FIG. 3 is applied to the input terminal P, the voltage of the node N1 is boosted as high as αVcc (α is the boosting ratio) and thus has Vcc−Vtn+αVcc. Accordingly, a NMOS transistor Q0 is turned on and a load capacitor CL is charged with electric charges. That is, some of the charges that are injected into the node N1 through a capacitor Cp is transferred to the node N2, and charges are injected into the load capacitor CL.

Since capacitance of the load capacitor CL is higher than that of the pumping capacitor Cp, the charge voltage ($\delta$) of the node N2 is low. If the voltage of the node N2 is increased and a voltage difference between the node N1 and the node N2 becomes Vtn, the NMOS transistor Q0 is turned off, so that charging is not performed. If the supply of the pulse is stopped, the voltage of the node N1 drops to below Vcc-Vtn, but is immediately recharged by means of the NMOS transistor Q1, thus returning to Vcc-tn. Thereafter, whenever the pulse is supplied to the input terminal P, the node N2 is charged and a voltage rises accordingly. Therefore, the voltage of the node N2 reaches $(1+\alpha)$Vcc-Vtn. The voltage level is maintained in the form of charges stored in the load capacitor CL. If the loss of charges occurs, the voltage level drops to this level. Thus, since the NMOS transistor Q0 is turned on and charges are thus injected into the load capacitor CL, the voltage level is immediately restored. Time that is taken for Vpp to reach a stable voltage level is determined according to the capacitance ratio between the pumping capacitor Cp and the load capacitor CL and the frequency of the pulse. This pulse is usually generated by the ring oscillator.

Figure 4:
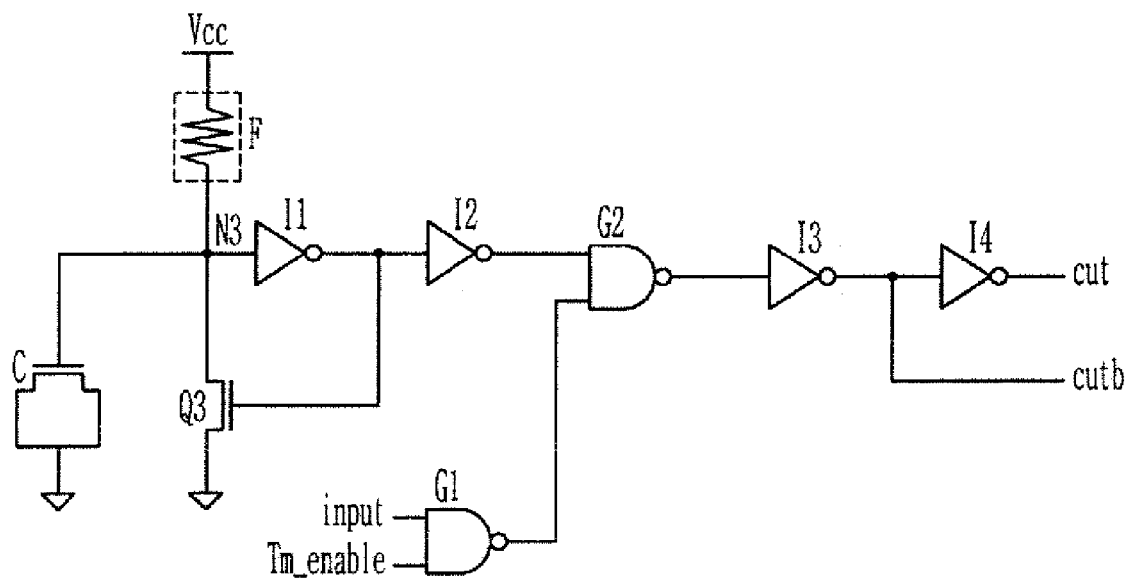
FIG. 4 is a detailed circuit diagram of a fuse tuning unit of FIG. 1.

FIG. 4 is a detailed circuit diagram of the fuse tuning unit of FIG. 1.

If the test mode enable signal Tm_enable is at a logic HIGH state, the output of a NAND gate G1 is at a logic LOW state regardless of an input signal. Thus, a NAND gate G2 can receive the input.

Since a fuse F has not been cut, a capacitor C is charged with Vcc, and a node N3 becomes a HIGH level. This HIGH level is provided to a NAND gate G2 via inverters I1 and I2. Since the output of the NAND gate G2 becomes a logic LOW state, the output cutb of an inverter I3 becomes a logic HIGH state, and the output cut of an inverter I4 becomes a logic LOW state. The output of the inverters I3 and I4 are decoded in the decoder 30.

Meanwhile, if the fuse F has been cut, the node N3 is in a logic LOW state. Since the output of the inverter I1 is in a logic HIGH state, the NMOS transistor Q3 is turned on. For this reason, the output of the inverter I1 is latched into the logic HIGH state. Since the output of the inverter I2 is a logic LOW state, the output of the NAND gate G2 is in the logic HIGH state. Accordingly, the output cutb of the inverter I3 is in a logic LOW state, whereas the output cutb of the inverter I4 is in the logic HIGH state. The outputs of the inverters I3 and I4 are decoded in the decoder 30.

Figure 5:
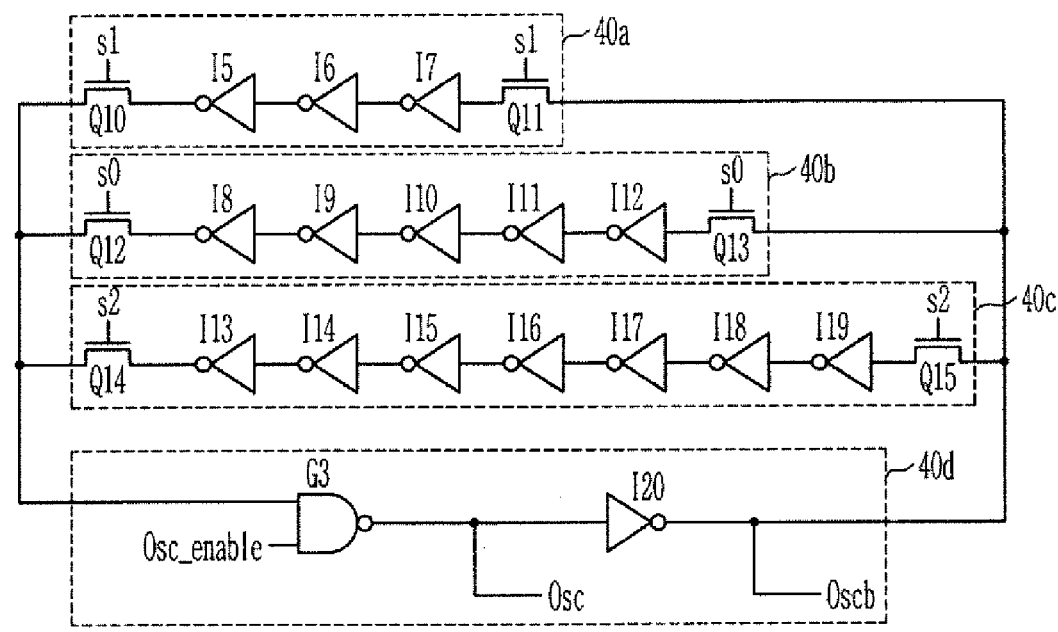
FIG. 5 is a detailed circuit diagram of a ring oscillator shown in FIG. 1.

FIG. 5 is a detailed circuit diagram of the ring oscillator shown in FIG. 1.

The ring oscillator includes first, second and third cycle control units 40a, 40b and 40c, and an output unit 40d all of which are connected in a parallel manner. The first to third cycle control units 40a, 40b and 40c are feedback paths of a ring oscillator having a different delay time. If an output s1 from the decoder 30 of FIG. 1 is in a logic HIGH state, NMOS transistors Q10 and Q11 of the first cycle control unit 40a are turned on, so that the first cycle control unit 40a is selected. In the first cycle control unit 40a, three inverters I5 to I7 are connected in a serial manner. If an output s0 from the decoder 30 of FIG. 1 is in a logic HIGH state, NMOS transistors Q12 and Q13 of the second cycle control unit 40b are turned on, so that the second cycle control unit 40b is selected. In the second cycle control unit 40b, five inverters I8 to I12 are connected in a serial manner. If an output s2 from the decoder 30 of FIG. 1 is in a logic HIGH state, NMOS transistors Q14 and Q15 of the third cycle control unit 40c are turned on, so that the third cycle control unit 40c is selected. In the third cycle control unit 40c, seven inverters I13 to I19 are connected in a serial manner. It is, however, to be noted that transmission gates can be used instead of the NMOS transistors Q10 to Q15 that serve to switch the first to third cycle control units.

If an enable signal Osc_enable applied to a NAND gate G3 of the output unit 40d is in a logic HIGH state, the output unit 40d is enabled and the ring oscillator operates accordingly. The output of the NAND gate G3 becomes the output Osc of the ring oscillator, and the inverter I20 inverts the output Osc of the ring oscillator, thereby generating an inverted output Oscb of the ring oscillator.

Figure 6:
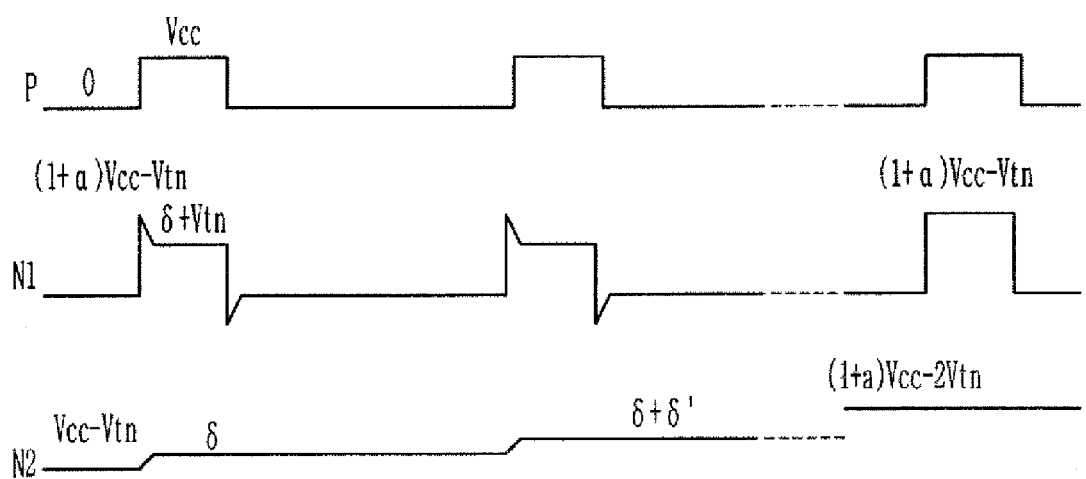
FIGS. 6 and 7 are waveforms for explaining the operation of a charge pump circuit according to the present invention.

That is, if the number of the inverter is small, the output frequency of the ring oscillator increases, whereas if the number of the inverter is many, the output frequency of the ring oscillator reduces. When the Vpp level reduces due to the loss of charges, a cycle control unit having a small number of inverters is selected so as to rapidly supplement the reduced amount of charges. Therefore, the frequency of the ring oscillator is increased as shown in FIG. 6. By doing so, since the pumping speed is increased, the Vpp level can be rapidly restored to its original value.

Figure 7:
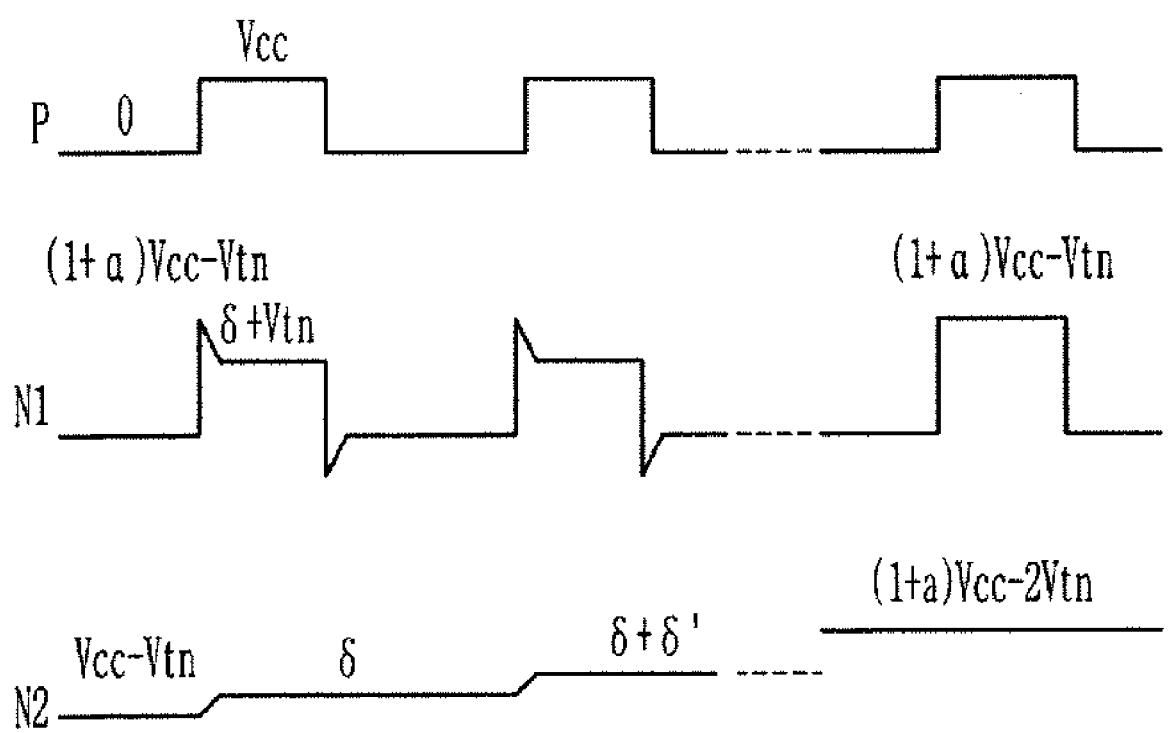

On the contrary, if charges are pumped in a too fast frequency, there is a danger that pumping efficiency may be lowered. In this case, a cycle control unit having a great number of inverters is selected, and the output frequency of the ring oscillator is thus reduced as shown in FIG. 7.

In the embodiment of the present invention, it has been described that the cycle control unit is constructed using the inverter chain. It is, however, to be understood that the cycle control unit can be constructed by combining RC delay circuits using resistors and capacitors.

After a desired output of the ring oscillator is obtained by means of the aforementioned method, if the fuse F of FIG. 4 is cut and the outputs S0 to S2 of the decoder 30 are fixed, one feedback path is selected in the ring oscillator.

As described above, according to the present invention, whenever a chip is activated, a high excessive current for driving internal circuits flows, which results in the loss of charges. However, a VPP level can be restored to its original value by rapidly supplying the lost charges to capacitors when the VPP level reduces.

Further, the cycle of a ring oscillator within a charge pump circuit can be freely controlled in a wafer level. That is, a test is performed while changing the cycle of the ring oscillator using an externally inputted control signal. A fuse is also cut and fixed by finding an optimum value. Therefore, the present invention has effects in that the time and cost necessary for the modification of a circuit and a mask re-work after FIB can be saved.

Although the foregoing description has been made with reference to the preferred embodiments, it is to be understood that changes and modifications of the present invention may be made by the ordinary skilled in the art without departing from the spirit and scope of the present invention and appended claims.

What is claimed as new and desired to be protected by Letters Patent of the United States is:

1. A charge pump circuit, comprising:
   a decoder for generating a plurality of control signals;
   a ring oscillator an output frequency of which varies according to the plurality of the control signals;
   a charge pump for generating a high voltage, which is higher than an external voltage, according to an output of the ring oscillator; and
   a fuse tuning unit for fixing one of the plurality of the control signals.

2. The charge pump circuit as claimed in claim 1, wherein the ring oscillator comprises:
a plurality of cycle control units which operate according to the plurality of the control signals and have a different delay time, the cycle control unit being connected in a parallel manner; and
an output unit connected to the plurality of the cycle control units in a parallel manner, for generating an output frequency according to an enable signal.

3. The charge pump circuit as claimed in claim 2, wherein each of the cycle control units comprises:
switching elements that are turned on according to the plurality of the control signals; and
a plurality of inverters, which operate according to the operation of the switching elements and are connected in a serial manner.

4. The charge pump circuit as claimed in claim 2, wherein each of the cycle control units comprises:
switching elements that are turned on according to the plurality of the control signals; and
RC delay circuits that operate according to the operation of the switching elements.

5. The charge pump circuit as claimed in claim 1, wherein the fuse tuning unit comprises:
a first logic combination unit for generating a logic signal depending upon whether a fuse has been cut;
a second logic combination unit for generating a logic signal according to an inputted signal; and
a third logic combination unit for generating a logic signal according to outputs of the first logic combination unit and the second logic combination unit.

6. The charge pump circuit as claimed in claim 5, wherein the first logic combination unit comprises:
a fuse connected between an external power supply and a first node;
a first inverter connected between the first node and a second node;
a transistor connected between the first node and a ground, the transistor being turned on according to a voltage of the second node; and
a second inverter for inverting the voltage of the second node.

7. The charge pump circuit as claimed in claim 6, further comprising a capacitor connected between the first node and the ground.

8. The charge pump circuit as claimed in claim 5, wherein the second logic combination unit comprises a NAND gate that operates according to the input signal and a test mode enable signal.

9. The charge pump circuit as claimed in claim 5, wherein the third logic combination unit comprises:
a NAND gate that operates according to the outputs of the first logic combination unit and the second logic combination unit;
a first inverter for inverting an output of the NAND gate; and
a second inverter for inverting an output of the first inverter.

10. The charge pump circuit as claimed in claim 3, wherein each of the switching elements is a transistor or a transmission gate.

11. A charge pump circuit, comprising:
a test mode control unit for generating a plurality of control signals according to a test mode enable signal and an input signal and fixing one of the plurality of the control signals depending upon whether a fuse has been cut or not;
a ring oscillator an output frequency of which varies according to an output of the test mode control unit;
a charge pump for generating a high voltage, which is higher than an external voltage, according to an output of the ring oscillator; and
a fuse tuning unit for fixing one of the plurality of the control signals.

12. The charge pump circuit as claimed in claim 1, wherein the test mode control unit comprises:
a fuse tuning unit for generating a logic signal according to the test mode enable signal and the input signal and fixing the logic signal according to whether the fuse has been cut; and
a decoder for generating a control signal according to an output of the fuse tuning unit.

13. The charge pump circuit as claimed in claim 11, wherein the ring oscillator comprises:
a plurality of cycle control units which operate according to the plurality of the control signals and have a different delay time, the cycle control unit being connected in a parallel manner; and
an output unit connected to the plurality of the cycle control units in a parallel manner, for generating an output frequency according to an enable signal.

14. The charge pump circuit as claimed in claim 13, wherein each of the cycle control units comprises:
switching elements that are turned on according to the plurality of the control signals; and
a plurality of inverters, which operate according to the operation of the switching elements and are connected in a serial manner.

15. The charge pump circuit as claimed in claim 13, wherein each of the cycle control units comprises:
switching elements that are turned on according to the plurality of the control signals; and
RC delay circuits that operate according to the operation of the switching elements.

16. The charge pump circuit as claimed in claim 12, wherein the fuse tuning unit comprises:
a first logic combination unit for generating a logic signal depending upon whether a fuse has been cut;
a second logic combination unit for generating a logic signal according to an inputted signal; and
a third logic combination unit for generating a logic signal according to outputs of the first logic combination unit and the second logic combination unit.

17. The charge pump circuit as claimed in claim 16, wherein the first logic combination unit comprises:
a fuse connected between an external power supply and a first node;
a first inverter connected between the first node and a second node;
a transistor connected between the first node and a ground, the transistor being turned on according to a voltage of the second node; and
a second inverter for inverting the voltage of the second node.

18. The charge pump circuit as claimed in claim 17, further comprising a capacitor connected between the first node and the ground.

19. The charge pump circuit as claimed in claim 16, wherein the second logic combination unit comprises a NAND gate that operates according to the input signal and a test mode enable signal.

20. The charge pump circuit as claimed in claim 16, wherein the third logic combination unit comprises:
- a NAND gate that operates according to the outputs of the first logic combination unit and the second logic combination unit;
- a first inverter for inverting an output of the NAND gate; and
- a second inverter for inverting an output of the first inverter.

21. The charge pump circuit as claimed in claim 14, wherein each of the switching elements is a transistor or a transmission gate.

* * * * *

UNITED STATES PATENT AND TRADEMARK OFFICE
CERTIFICATE OF CORRECTION

| | | |
|---|---|---|
| PATENT NO. | : 7,129,772 B2 | Page 1 of 1 |
| APPLICATION NO. | : 10/906638 | |
| DATED | : October 31, 2006 | |
| INVENTOR(S) | : Kwang H. Kim et al. | |

It is certified that error appears in the above-identified patent and that said Letters Patent is hereby corrected as shown below:

At Column 4, line 61, "an output frequency of" should be -- for outputting an output frequency --

At Column 6, line 1, "an output frequency of" should be -- for outputting an output frequency --

At Column 6, line 8, "claim 1" should be -- claim 11 --

Signed and Sealed this
Tenth Day of May, 2011

David J. Kappos
*Director of the United States Patent and Trademark Office*